United States Patent
Liu

(10) Patent No.: US 10,854,618 B2
(45) Date of Patent: Dec. 1, 2020

(54) MEMORY DEVICE AND METHOD OF FORMING THE SAME

(71) Applicant: TAIWAN SEMICONDUCTOR MANUFACTURING COMPANY LTD., Hsinchu (TW)

(72) Inventor: Chien Hung Liu, Hsinchu County (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 15/719,466

(22) Filed: Sep. 28, 2017

(65) Prior Publication Data
US 2019/0096898 A1   Mar. 28, 2019

(51) Int. Cl.
| H01L 27/11524 | (2017.01) |
| H01L 27/11582 | (2017.01) |
| H01L 27/11529 | (2017.01) |
| H01L 27/1157 | (2017.01) |
| H01L 27/11548 | (2017.01) |
| H01L 27/11573 | (2017.01) |
| H01L 27/11556 | (2017.01) |
| H01L 27/11575 | (2017.01) |

(52) U.S. Cl.
CPC .... *H01L 27/11524* (2013.01); *H01L 27/1157* (2013.01); *H01L 27/11548* (2013.01); *H01L 27/11556* (2013.01); *H01L 27/11573* (2013.01); *H01L 27/11575* (2013.01); *H01L 27/11582* (2013.01); *H01L 27/11529* (2013.01)

(58) Field of Classification Search
CPC ......... H01L 27/11524; H01L 27/11575; H01L 27/11582; H01L 27/11548; H01L 27/1157; H01L 27/11529; H01L 27/11573; G11C 16/10; G11C 16/16; G11C 16/3459; G11C 16/14; G11C 16/3404; G11C 16/0843; G11C 16/3409
See application file for complete search history.

(56) References Cited

U.S. PATENT DOCUMENTS

| 2009/0113166 A1* | 4/2009 | Houston ............. G06F 11/1068 711/216 |
| 2014/0189258 A1* | 7/2014 | Aritome ................. G06F 12/00 711/147 |
| 2014/0269078 A1* | 9/2014 | Hsiao ................ H01L 21/28282 365/185.17 |

(Continued)

OTHER PUBLICATIONS

Jaeduk Lee, Jaehoon Jang, Junhee Lim, Yu Gyun Shin, Kyupil Lee, and Eunseung Jung, A new ruler on the storage market: 3D-NAND flash for high-density memory and its technology evolutions and challenges on the future, IEEE, 2016, p. 11.2.1-11.2.4.

(Continued)

*Primary Examiner* — Galina G Yushina
(74) *Attorney, Agent, or Firm* — Juan Carlos A. Marquez; Marquez IP Law Office, PLLC

(57) ABSTRACT

A memory device includes: a conductive layer coupled to a reference voltage level; a first storage portion vertically coupled to a first surface of the conductive layer; and a second storage portion vertically coupled to a second surface of the conductive layer; wherein the second surface is opposite to the first surface.

20 Claims, 12 Drawing Sheets

(56) References Cited

U.S. PATENT DOCUMENTS

| | | | |
|---|---|---|---|
| 2015/0003158 A1* | 1/2015 | Aritome | G11C 16/0483 365/185.11 |
| 2015/0098274 A1* | 4/2015 | Rhie | G11C 16/0483 365/185.17 |
| 2015/0221380 A1* | 8/2015 | Lee | G11C 16/10 365/185.11 |
| 2016/0163730 A1* | 6/2016 | Lim | H01L 27/11582 257/314 |
| 2017/0062527 A1* | 3/2017 | Konno | H01L 27/2463 |
| 2017/0179148 A1* | 6/2017 | Kwon | H01L 21/76816 |
| 2018/0040629 A1* | 2/2018 | Eom | H01L 27/11575 |
| 2019/0096898 A1* | 3/2019 | Liu | H01L 27/11524 |

OTHER PUBLICATIONS

Jaehoon Jang, Han-Soo Kim, Wonseok Cho, Hoosung Cho, Jinho Kim, Sun Il Shim, Younggoan Jang, Jae-Hun Jeong, Byoung-Keun Son, Dong Woo Kim, Kihyun Kim, Jae-Joo Shim, Jin Soo Lim, Kyoung-Hoon Kim, Su Youn Yi, Ju-Young Lim, Dewill Chung, Hui-Chang Moon, Sungmin Hwang, Jong-Wook Lee, Yong-Hoon Son, U-In Chung and Won-Seong Lee, Vertical Cell Array using TCAT (Terabit Cell Array Transistor) Technology for Ultra High Density NAND Flash Memory, 2009 Symposium on VLSI.

\* cited by examiner

US 10,854,618 B2

MEMORY DEVICE AND METHOD OF FORMING THE SAME

BACKGROUND

3D NAND memory is a flash memory in which memory cells are stacked vertically to provide much higher storage density and lower cost per gigabyte in comparison to an existing NAND memory. The density of 3D NAND memory is increased by stacking more memory gate films or transistor layers. However, the transistors cascode connected would increase the channel resistance of a 3D NAND memory cell. The increased channel resistance would seriously degrade the turn-on current of the 3D NAND memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
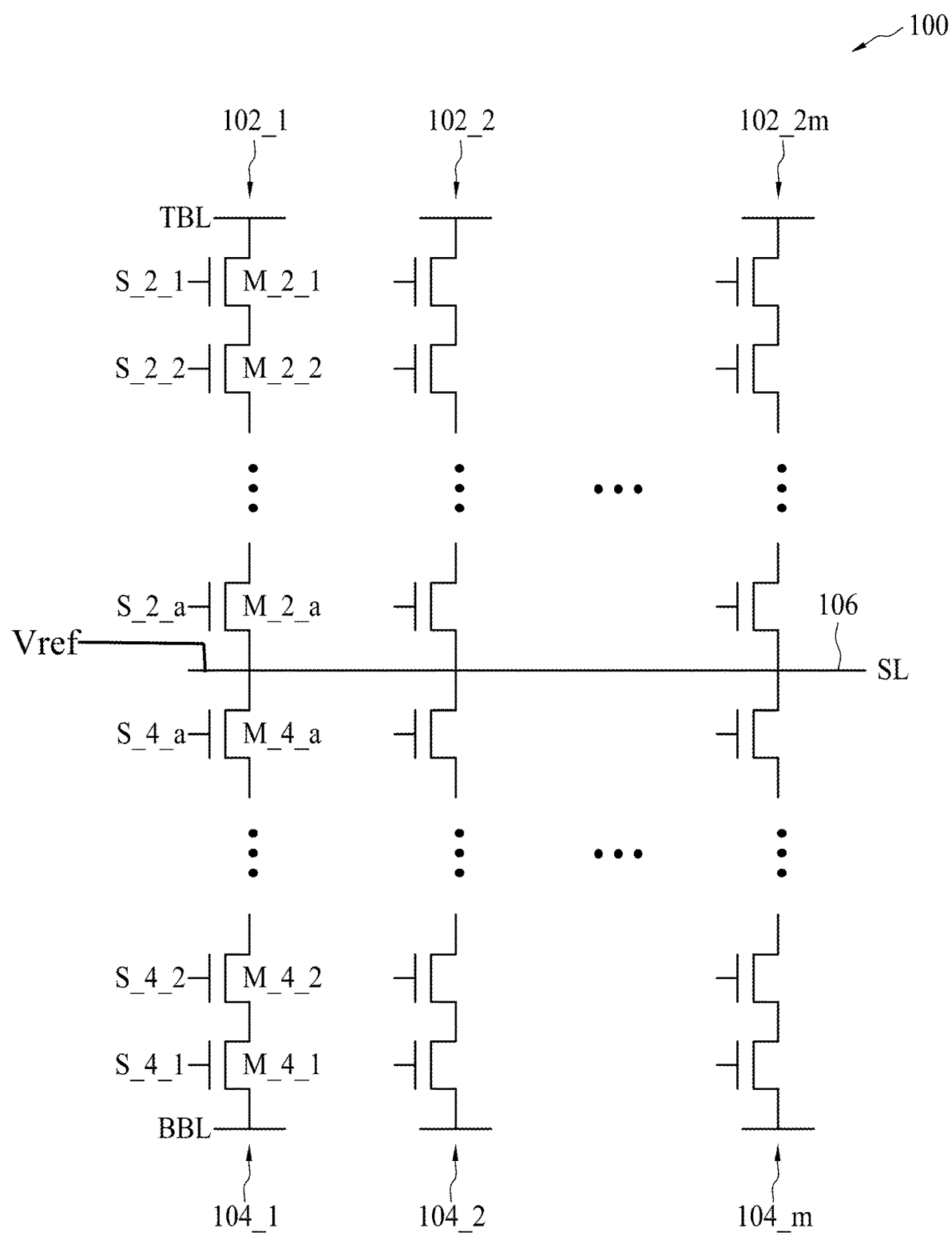
FIG. 1 is a schematic diagram illustrating a memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "lower," "above," "upper", "lower", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a schematic diagram illustrating a memory device 100 in accordance with some embodiments. The memory device 100 may be a 3D (3-dimensional) NAND memory device. The memory device 100 comprises a plurality of transistor strings 102_1-102_m and a plurality of transistor strings 104_1-104_m, m being a natural number. Each of the transistor strings 102_1-102_m comprises at least one field-effect transistor or a string of transistors. In a transistor string that comprises a plurality of field-effect transistors, such as two field-effect transistors, the plurality of field-effect transistors are connected in series (cascode connected). Also, each of the transistor strings 104_1-104_m comprises at least one field-effect transistor. Similarly, in a transistor string that comprises a plurality of field-effect transistors, such as two field-effect transistors, the plurality of field-effect transistors are connected in series (cascode connected). Moreover, the number of transistors in a transistor string 102_x of the transistor strings 102_1-102_m may be different from the number of transistors in the corresponding transistor string 104_x of the transistor strings 104_1-104_m.

According to the embodiment of FIG. 1, each of the transistor strings 102_1-102_m and the transistor strings 104_1-104_m comprises the same number of transistors. For example, the transistor string 102_1 comprises a plurality of transistors $M\_2\_1$ through $M\_2\_a$, and the transistor string 104_1 comprises a plurality of transistors $M\_4\_1$ through $M\_4\_a$. However, this is not a limitation of the embodiment. The transistor number of a transistor string in the transistor strings 102_1-102_m may different from the transistor number of a transistor string in the transistor strings 104_1-104_m. In addition, the transistor string 102_1 has a first terminal coupled to a top bit line path TBL, and a second terminal coupled to a source line SL. The transistor string 104_1 has a first terminal coupled to a bottom bit line path BBL, and a second terminal coupled to the source line SL. Specifically, a connecting terminal of the transistor $M\_2\_1$ is electrically connected to the top bit line path TBL, and a connecting terminal of the transistor $M\_2\_a$ is electrically connected to the source line SL. The transistors $M\_2\_1$-$M\_2\_a$ are connected in series between the top bit line path TBL and the source line SL. A connecting terminal of the transistor $M\_4\_1$ is electrically connected to the bottom bit line path BBL, and a connecting terminal of the transistor $M\_4\_a$ is electrically connected to the source line SL. The transistors $M\_4\_1$-$M\_4\_a$ are connected in series between the bottom bit line path BBL and the source line SL. In addition, the transistors $M\_2\_1$-$M\_2\_a$ in combination with the transistors $M\_4\_1$-$M\_4\_a$ are configured to serve as a memory cell. The memory cell may comprise a plurality of storage units arranged to store a plurality of bits. The transistors $M\_2\_1$-$M\_2\_a$ and $M\_4\_1$-$M\_4\_a$ may be the storage units. Each of the transistors $M\_2\_1$-$M\_2\_a$ and $M\_4\_1$-$M\_4\_a$ may be arranged to store one or more bits. The transistors $M\_2\_1$-$M\_2\_a$ and $M\_4\_1$-$M\_4\_a$ are controlled by a plurality of word line signals $S\_2\_1$-$S\_2\_a$ and $S\_4\_1$-$S\_4\_a$, respectively. According to one embodiment, each storage unit of the plurality of first storage units (i.e. $M\_2\_1$-$M\_2\_a$) and the plurality of second storage units (i.e. $M\_4\_1$-$M\_4\_a$) is formed by an n-channel field-effect transistor. According to another embodiment, each storage unit of the plurality of first storage units (i.e. $M\_2\_1$-$M\_2\_a$) and the plurality of second storage units (i.e. $M\_4\_1$-$M\_4\_a$) is formed by a p-channel field-effect transistor. Accordingly, for one memory cell of the memory device 100, the memory cell has two output terminals, i.e. the top bit line path TBL and the bottom bit line path BBL. The source line SL is coupled to a reference voltage level Vref, such as a ground voltage. It is noted that the other transistor strings 102_2-102_m and the transistor strings 104_2-104_m have the similar configuration to the transistor string 102_1 and the transistor string 104_1, respectively, and thus the detailed description is omitted here for brevity.

According to the embodiment of FIG. 1, the memory cell is divided into the transistors $M\_2\_1$-$M\_2\_a$ and $M\_4\_1$-$M\_4\_a$ by the source line SL. When the transistors $M\_2\_1$-$M\_2\_a$ and $M\_4\_1$-$M\_4\_a$ are turned on by the word line signals $S\_2\_1$-$S\_2\_a$ and $S\_4\_1$-$S\_4\_a$ respectively, a current may flow to the source line SL from the first bit line TBL, and/or another current may flow to the source line SL from the second bit line BBL. In other words, for a memory cell, the current path is divided into two paths, the first path is formed by the serially connected channels of the transistors $M\_2\_1$-$M\_2\_a$, and the second path is formed by the serially connected channels of the transistors $M\_4\_1$-$M\_4\_a$. Therefore, the electrical string length (i.e. the first path or the second path) of the memory cell is reduced. When the electrical string length of the memory cell is reduced, the channel resistance of the memory cell is also reduced. When the channel resistance of the memory cell is reduced, the current flowed to the source line SL from the first bit line TBL, and/or the current flowed to the source line SL from the second bit line BBL is increased. Accordingly, the ON state current of the memory cell is not degraded even though the transistors $M\_2\_1$-$M\_2\_a$ and $M\_4\_1$-$M\_4\_a$ are connected in series. In comparison to the related art, the ON state current may directly flow to the transistor $M\_4\_1$ from the transistor $M\_2\_1$, in which the channel resistance is relatively large and remarkably reduces the ON state current.

It is noted that the transistors $M\_2\_1$-$M\_2\_a$ in combination with the transistors $M\_4\_1$-$M\_4\_a$ are configured to be a single memory cell, and the memory cell is controlled by the word line signals $S\_2\_1$-$S\_2\_a$ and $S\_4\_1$-$S\_4\_a$ during the operation. For example, when one of the word line signals $S\_2\_1$-$S\_2\_a$ and $S\_4\_1$-$S\_4\_a$ turns on/off a corresponding transistor in the transistors $M\_2\_1$-$M\_2\_a$ and $M\_4\_1$-$M\_4\_a$, the top bit line path TBL and the bottom bit line path BBL are arranged to simultaneously output/receive the corresponding signals respectively. Then, a processing device (not shown) may be arranged to determine the data stored in the memory cell according to the signals of the top bit line path TBL and the bottom bit line path BBL. In other words, the memory cell is controlled by a predetermined number of input signals, and the predetermined number is a total number of the word line signals $S\_2\_1$-$S\_2\_a$ and $S\_4\_1$-$S\_4\_a$.

Figure 2:
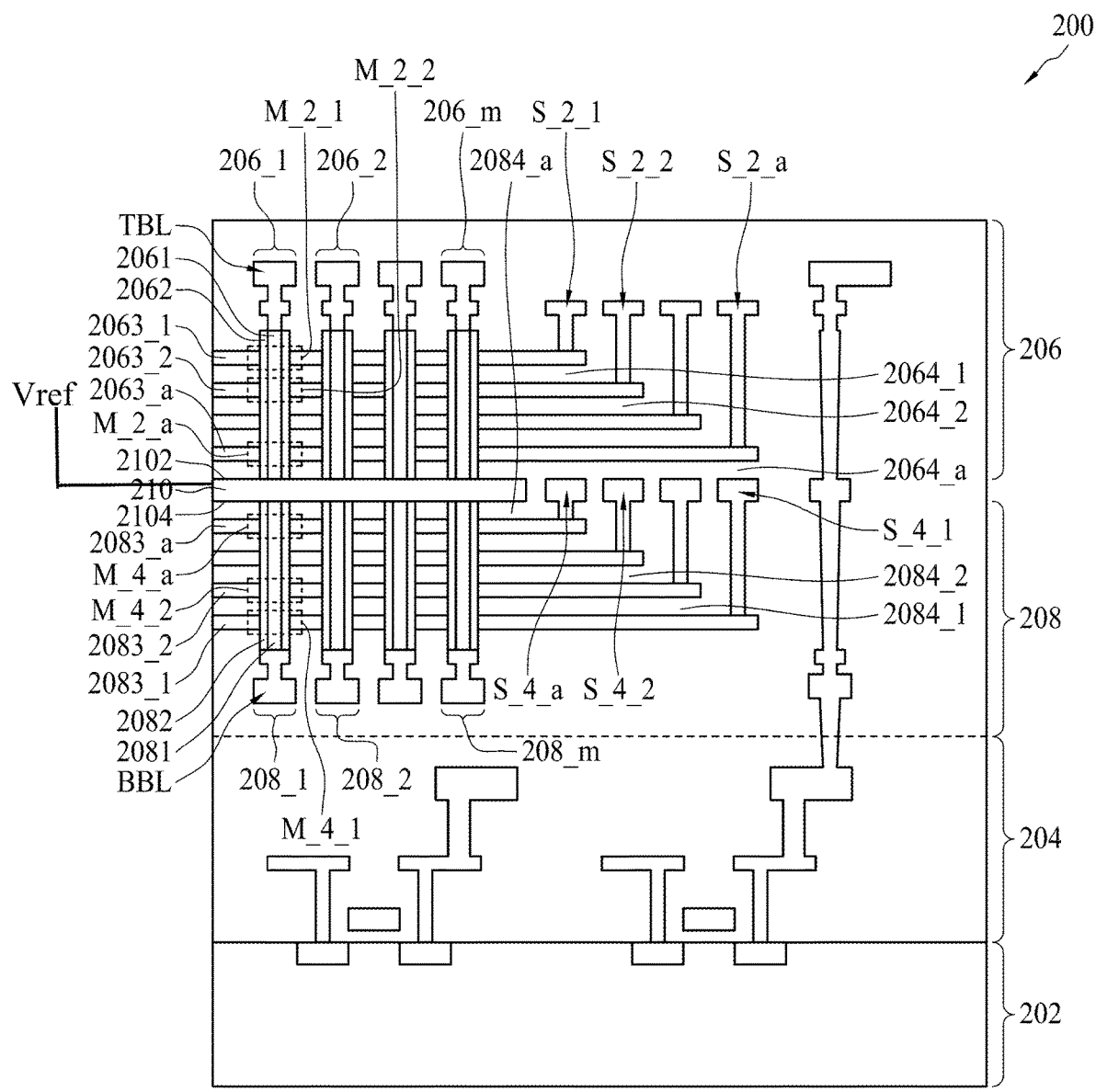
FIG. 2 is a cross-sectional diagram illustrating a memory device in accordance with some embodiments.

FIG. 2 is a cross-sectional diagram illustrating a memory device 200 in accordance with some embodiments. The memory device 200 may be a structural layout of the memory device 100. The memory device 200 comprises a substrate 202, an interconnecting layer 204, a first storage portion 206, a second storage portion 208, and a conductive layer 210. The substrate 202 and the interconnecting layer 204 are configured to have a peripheral circuit of the memory device 200. The second storage portion 208 is formed on the interconnecting layer 204. The conductive layer 210 is disposed on the second storage portion 208. The first storage portion 206 is disposed on the conductive layer 210. Therefore, the second storage portion 208, the conductive layer 210, and the first storage portion 206 are vertically stacked on the interconnecting layer 204. According to some embodiments, the peripheral circuit may be electrically connected to the first storage portion 206, the second storage portion 208, and/or the conductive layer 210.

More specifically, the conductive layer 210 is a source line and electrically connected to a reference voltage level Vref, e.g. the ground voltage. The conductive layer 210 has a first surface (i.e. the top surface) 2102 and a second surface (i.e. the bottom surface) 2104. The first surface 2102 is opposite to the second surface 2104 in vertical direction. The first storage portion 206 and the second storage portion 208 are electrically connected to the first surface 2102 and the second surface 2104, respectively. The first storage portion 206 comprises a plurality of storage strings 206_1-206_m. The second storage portion 208 comprises a plurality of storage strings 208_1-208_m. The storage strings 206_1-206_m are formed on the first surface 2102, and the storage strings 208_1-208_m are formed on the corresponding locations on the second surface 2104 respectively. Each of the storage strings 206_1-206_m comprises a plurality of storage units. Each of the storage strings 208_1-208_m comprises a plurality of storage units. For brevity, the detailed description of the memory device 200 is focused on the storage string 206_1 and the corresponding storage string 208_1.

According to some embodiments, the storage string 206_1 comprises a channel layer 2061, a dielectric layer 2062, a plurality of conductive layers 2063_1-2063_a, and a plurality insulating layers 2064_1-2064_a. The plurality of conductive layers 2063_1-2063_a may be formed by polysilicon or metal (e.g. Tungsten). The channel layer 2061 may be a pillar perpendicularly disposed on the conductive layer 210. The channel layer 2061 has a first end electrically connected to the first surface 2102, and a second end electrically connected to the first bit line TBL. The dielectric layer 2062 is arranged to surround the channel layer 2061. According to some embodiments, the insulating layers 2064_1-2064_a, the conductive layers 2063_1-2063_a, and the conductive layer 210 are arranged to be parallel with each other. The insulating layers 2064_1-2064_a and the conductive layers 2063_1-2063_a are perpendicularly disposed above the first surface 2102 of the conductive layer 210. Moreover, the conductive layers 2063_1-2063_a are alternately disposed on the insulating layers 2064_1-2064_a. The conductive layers 2063_1-2063_a are in contact with the dielectric layer 2062. The conductive layers 2063_1-2063_a are electrically connected to the word line signals S_2_1-S_2_a respectively. The transistors M_2_1-M_2_a are formed on the intersecting areas of the conductive layers 2063_1-2063_a and the channel layer 2061 as shown in FIG. 2.

In addition, the storage string 208_1 comprises a channel layer 2081, a dielectric layer 2082, a plurality of conductive layers 2083_1-2083_a, and a plurality insulating layers 2084_1-2084_a. The plurality of conductive layers 2083_1-2083_a may be formed by polysilicon or metal (e.g. Tungsten). The channel layer 2081 may be a pillar perpendicularly disposed on the conductive layer 210. The channel layer 2081 has a first end electrically connected to the second surface 2104, and a second end electrically connected to the second bit line BBL. The dielectric layer 2082 is arranged to surround the channel layer 2081. According to some embodiments, the insulating layers 2084_1-2084_a, the conductive layers 2083_1-2083_a, and the conductive layer 210 are arranged to be parallel with each other. The insulating layers 2084_1-2084_a and the conductive layers 2083_1-2083_a are vertically stacked below the second surface 2104 of the conductive layer 210. Moreover, the conductive layers 2083_1-2083_a are alternately disposed on the insulating layers 2084_1-2084_a. The conductive layers 2083_1-2083_a are in contact with the dielectric layer 2082. The conductive layers 2083_1-2083_a are electrically connected to the word line signals S_4_1-S_4_a respectively. The transistors M_4_1-M_4_a are formed on the intersecting areas of the conductive layers 2083_1-2083_a and the channel layer 2081 as shown in FIG. 2.

According to the embodiment of FIG. 2, a channel of the memory cell is divided into channel layer 2061 and the channel layer 2081 by the conductive layer 210. Therefore, the electrical string length (i.e. the length of the channel layer 2061 and the length of the channel layer 2081) of the memory cell is reduced. When the electrical string length of the memory cell is reduced, the channel resistance of the memory cell is also reduced. When the channel resistance of the memory cell is reduced, the current flowed to the source line SL from the top bit line path TBL, and/or the current flowed to the source line SL from the bottom bit line path BBL is increased. Accordingly, the ON state current of the memory cell is not degraded even though the transistors M_2_1-M_2_a and M_4_1-M_4_a are connected in series. Therefore, by applying the present configuration, when more transistors are connected in series in a 3D NAND memory cell, the ON state current and the ON-OFF window of the 3D NAND memory cell may be kept intact.

Figure 3:
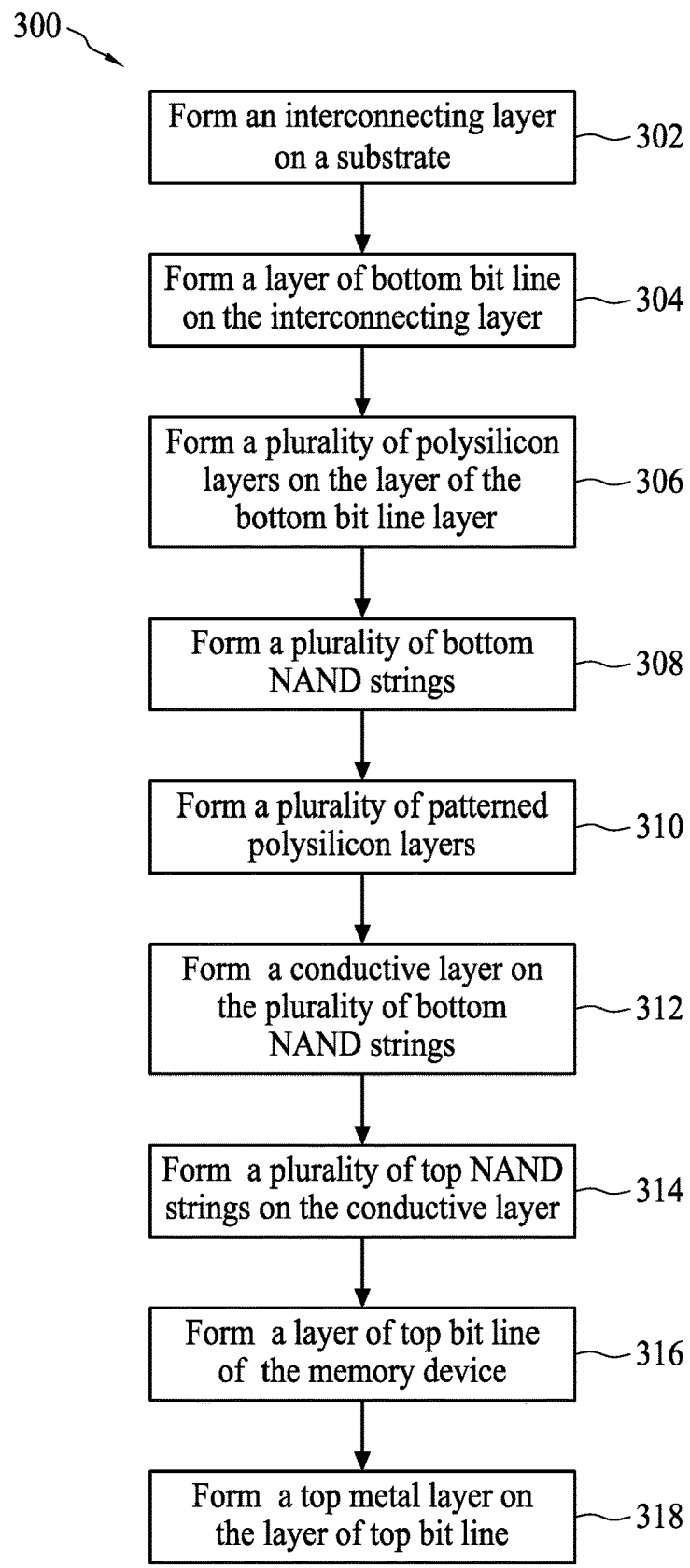
FIG. 3 is a flow diagram illustrating a method of fabricating the memory device of FIG. 2 in accordance with some embodiments.

FIG. 3 is a flow diagram illustrating a method 300 of fabricating the memory device 200 in accordance with some embodiments. The method 300 comprises operations 302, 304 . . . 316 and 318. FIGS. 4-12 are diagrams illustrating stages in the fabrication of the memory device 200 in accordance with some embodiments.

Figure 4:
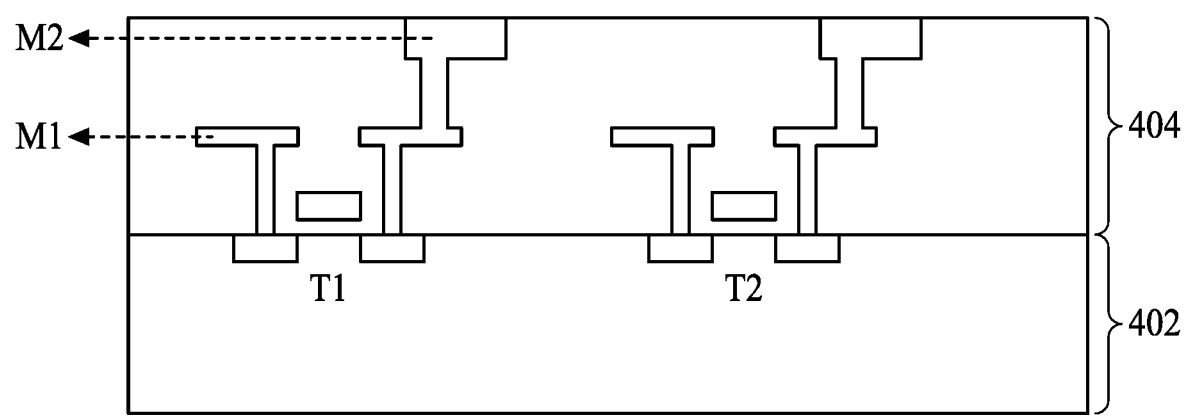
FIG. 4 is a cross-sectional view of a substrate and an interconnecting layer formed during a fabricating process in accordance with some embodiments.
Figure 5:
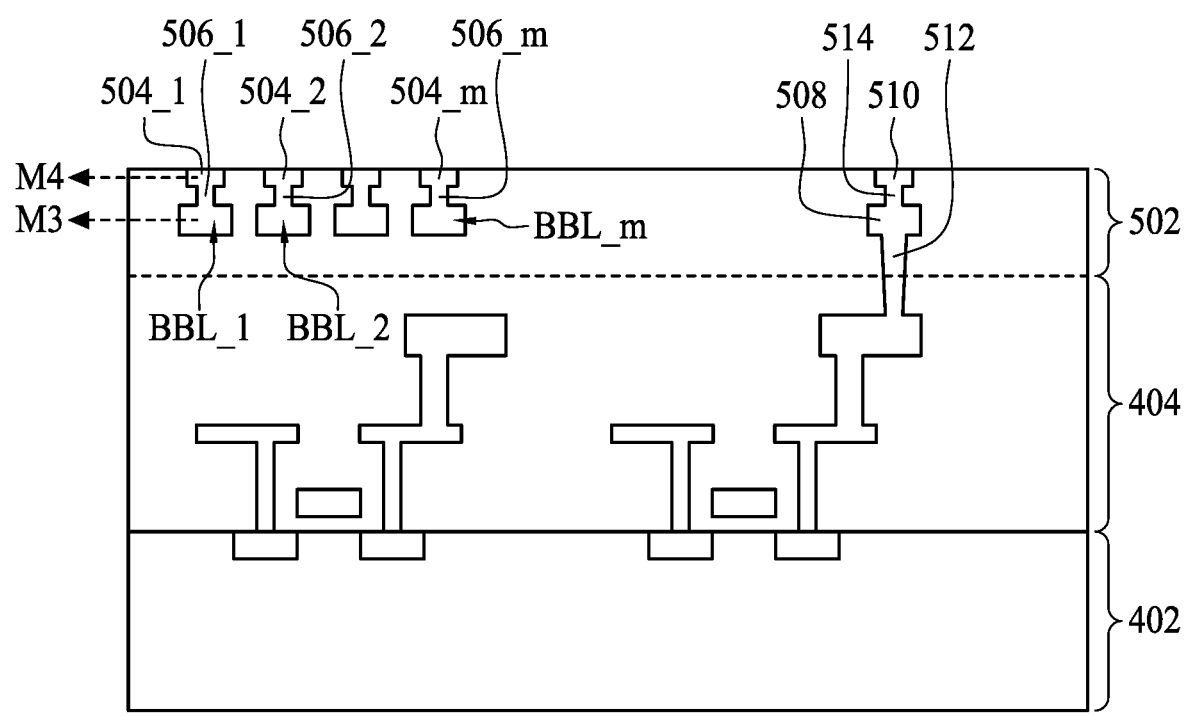
FIG. 5 is a cross-sectional view of a layer of bottom bit line formed during the fabricating process in accordance with some embodiments.
Figure 6:
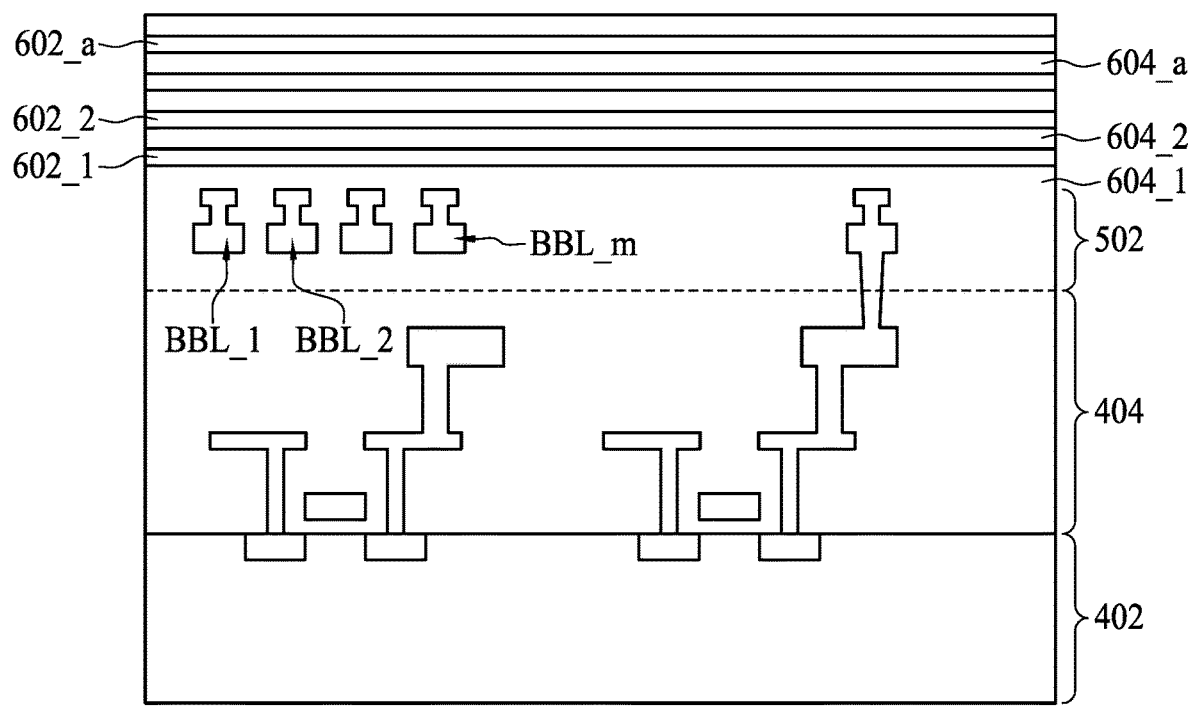
FIG. 6 is a cross-sectional view of a plurality of conductive layers formed during the fabricating process in accordance with some embodiments.
Figure 7:
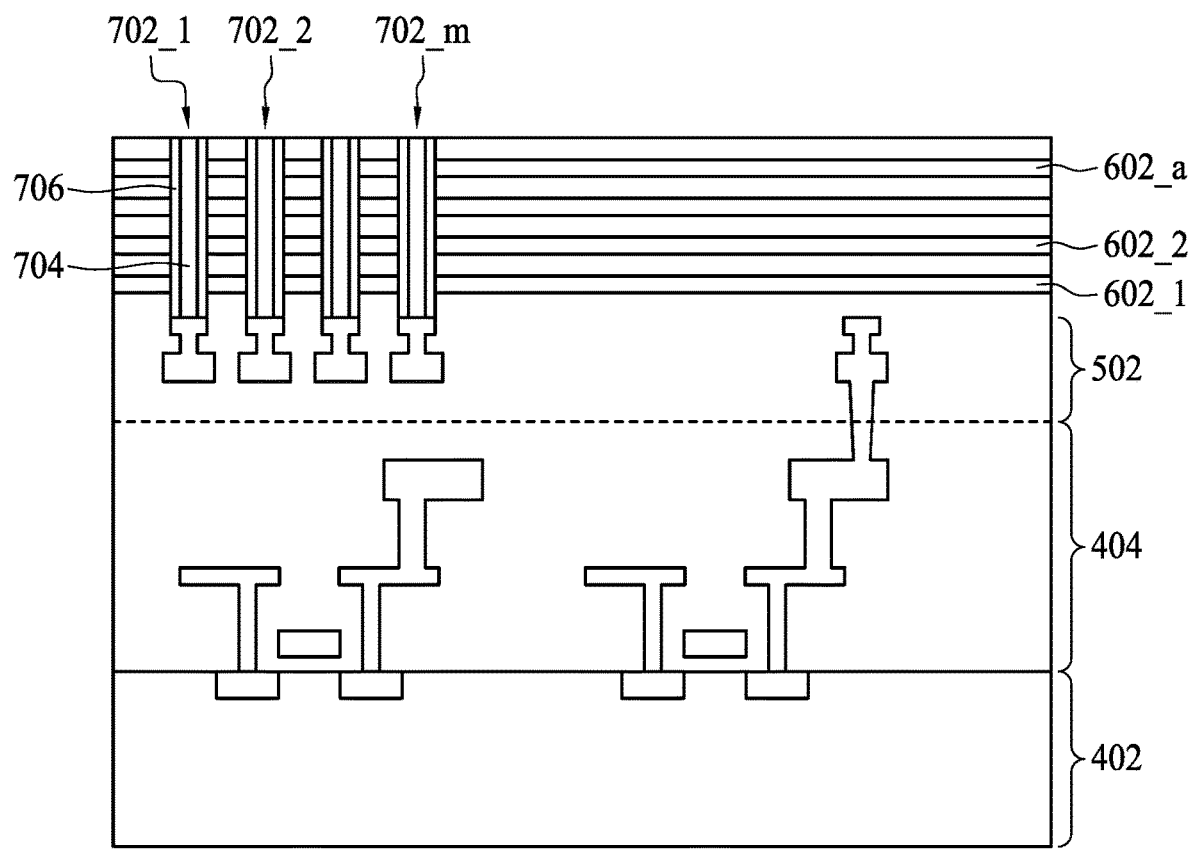
FIG. 7 is a cross-sectional view of a plurality of bottom NAND strings formed during the fabricating process in accordance with some embodiments.
Figure 8:
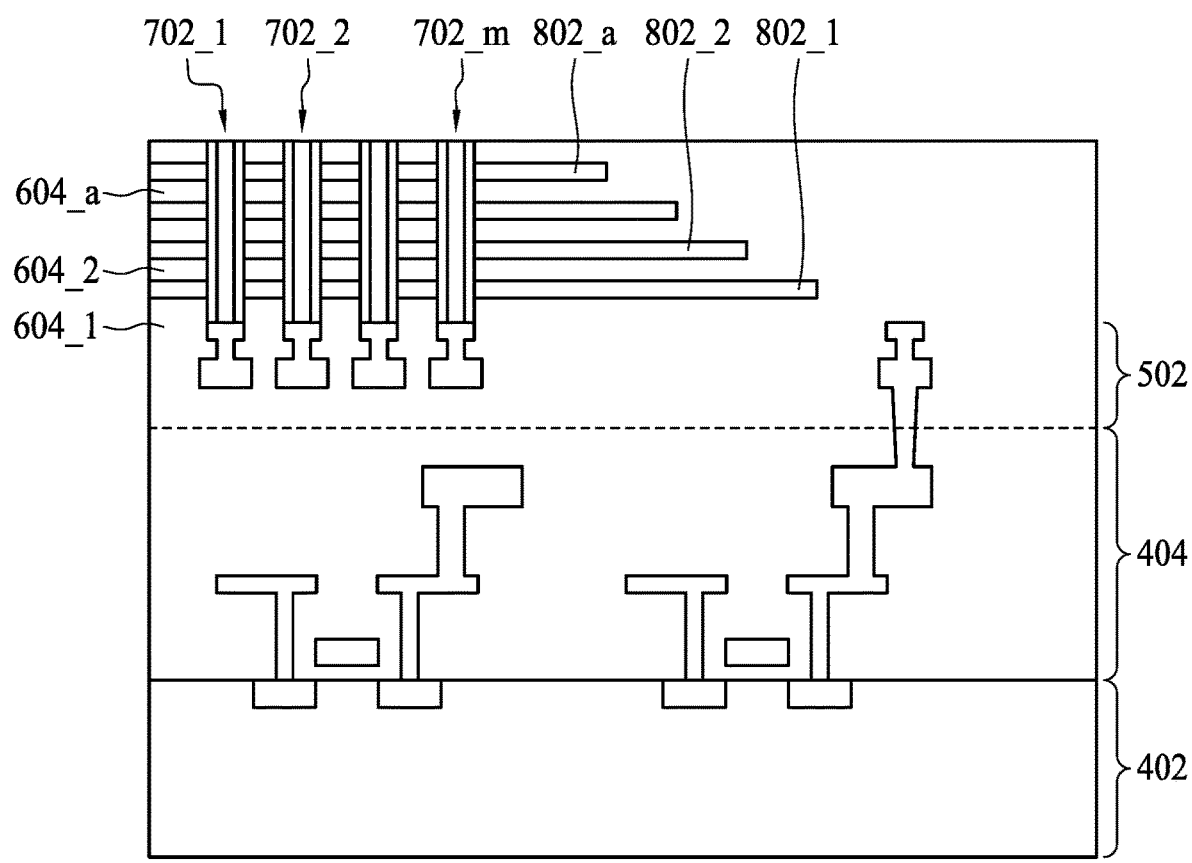
FIG. 8 is a cross-sectional view of a plurality of patterned conductive layers formed during the fabricating process in accordance with some embodiments.
Figure 9:
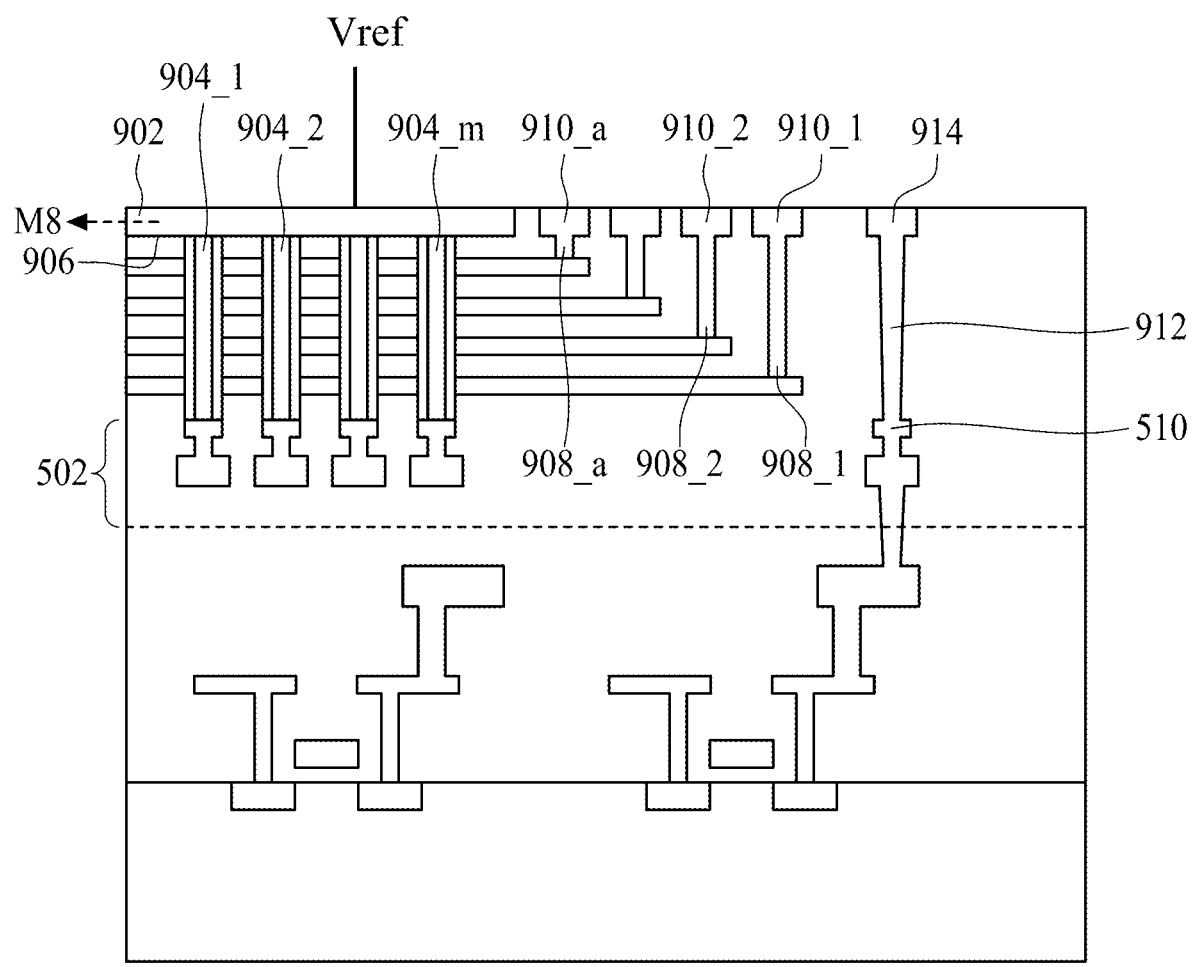
FIG. 9 is a cross-sectional view of a conductive layer formed during the fabricating process in accordance with some embodiments.
Figure 10:
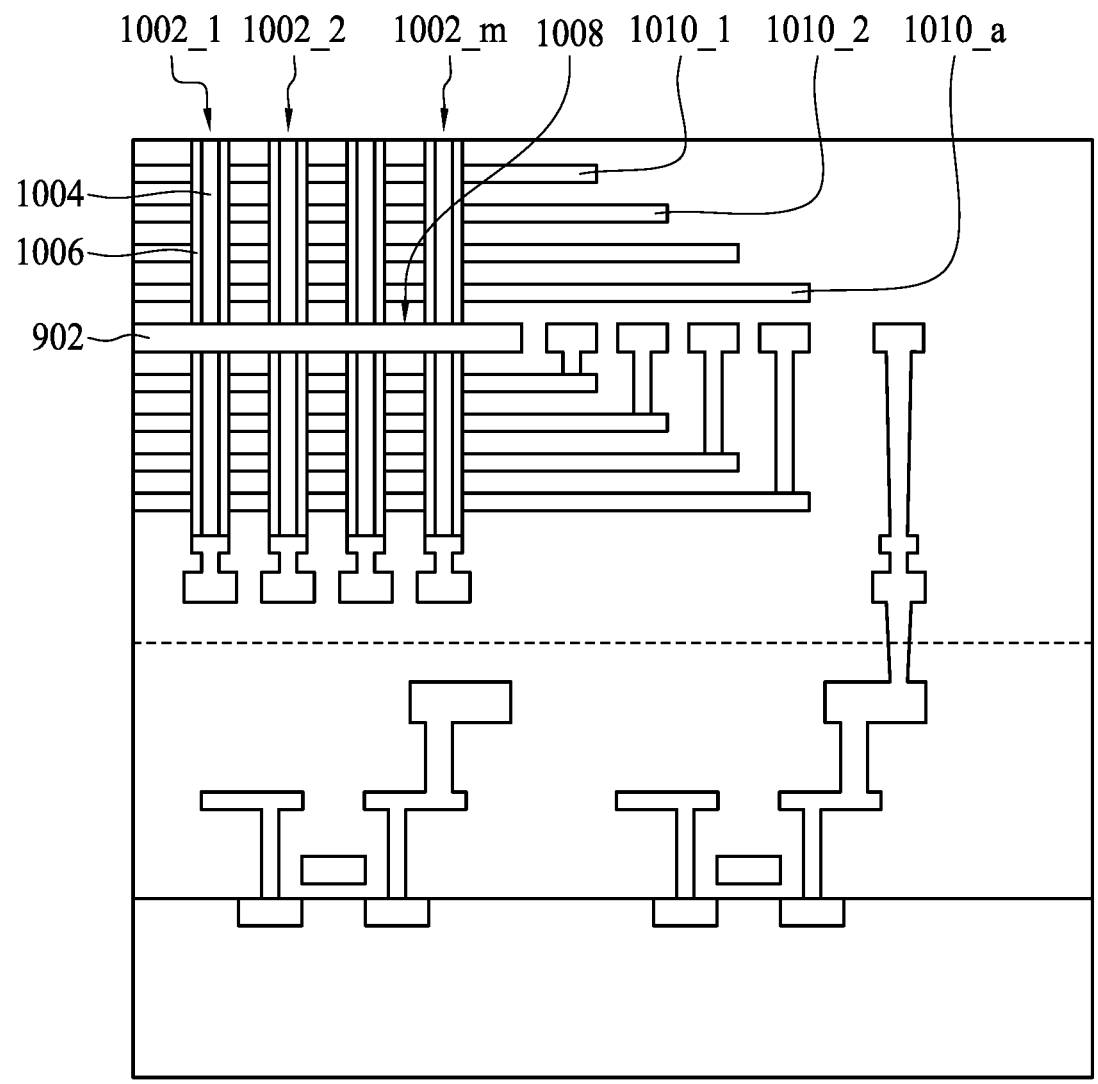
FIG. 10 is a cross-sectional view of a plurality of top NAND strings formed during the fabricating process in accordance with some embodiments.
Figure 11:
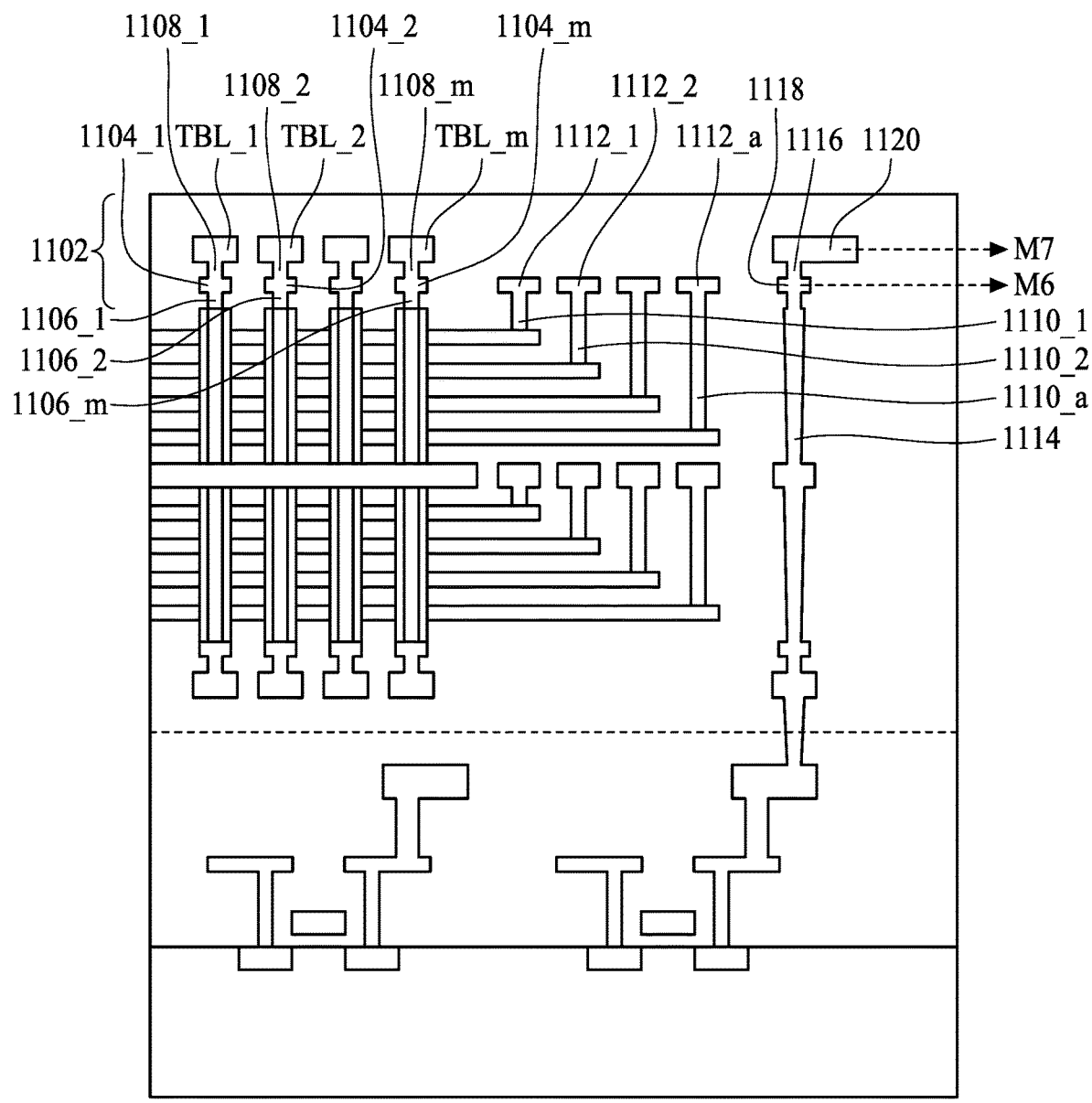
FIG. 11 is a cross-sectional view of a layer of top bit line formed during the fabricating process in accordance with some embodiments.
Figure 12:
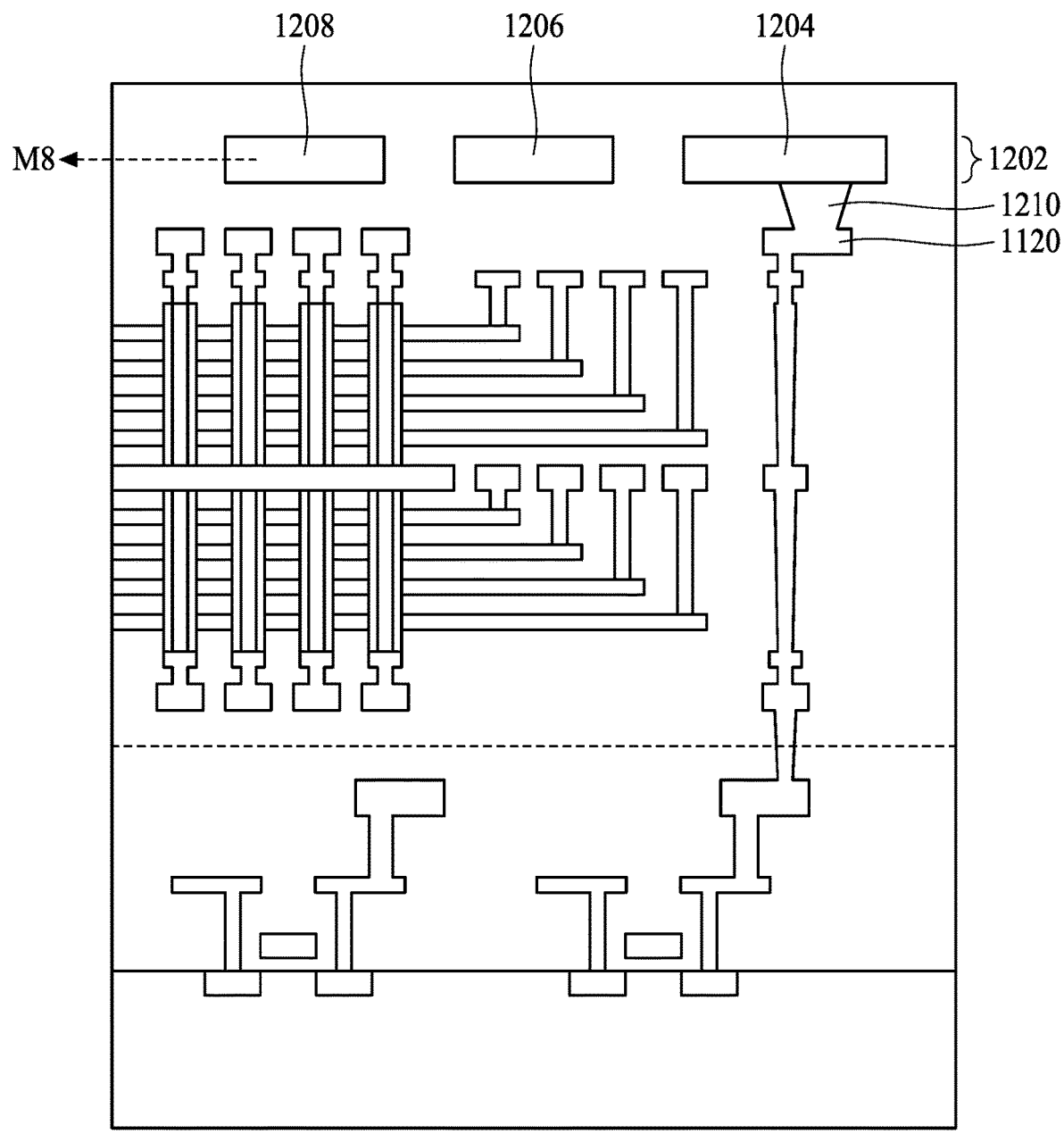
FIG. 12 is a cross-sectional view of a top metal layer formed during the fabricating process in accordance with some embodiments.

Specifically, FIG. 4 is a cross-sectional view of a substrate 402 and an interconnecting layer 404 formed during a fabricating process in accordance with some embodiments. FIG. 5 is a cross-sectional view of a layer 502 of bottom bit line formed during the fabricating process in accordance with some embodiments. FIG. 6 is a cross-sectional view of a plurality of conductive layers 602_1-602_a formed during the fabricating process in accordance with some embodiments. FIG. 7 is a cross-sectional view of a plurality of bottom NAND strings 702_1-702_m formed during the fabricating process in accordance with some embodiments. FIG. 8 is a cross-sectional view of a plurality of patterned conductive layers 802_1-802_a formed during the fabricating process in accordance with some embodiments. FIG. 9 is a cross-sectional view of a conductive layer 902 formed during the fabricating process in accordance with some embodiments. FIG. 10 is a cross-sectional view of a plurality of top NAND strings 1002_1-1002_m formed during the fabricating process in accordance with some embodiments. FIG. 11 is a cross-sectional view of a layer 1102 of top bit line formed during the fabricating process in accordance with some embodiments. FIG. 12 is a cross-sectional view of a top metal layer 1202 formed during the fabricating process in accordance with some embodiments. The method is a simplified semiconductor process. Therefore, other steps or operations may be incorporated in the process.

Referring to FIG. 4, in operation 302, the interconnecting layer 404 is formed on the substrate 402. The substrate 402 and the interconnecting layer 404 are configured to be the peripheral circuit of the memory device. In the interconnecting layer 404, a plurality of field-effect transistors (e.g. T1 and T2) are formed on the substrate 402. A plurality of gate layers are formed in the interconnecting layer 404 for controlling the field-effect transistors respectively. The interconnecting layer 404 further includes a plurality of metal paths formed in a first metal layer M1 and a second metal layer M2. The first metal layer M1 is the lowest or bottom metal layer, and the second metal layer M2 is the second lowest metal layer of the semiconductor device. It is noted that a plurality of contacts are arranged to connect the metal paths in the first metal layer M1 and the substrate 402 respectively, and a plurality of vias are arranged to connect the metal paths in the first metal layer M1 and the metal paths in the second metal layer M2 respectively.

Referring to FIG. 5, in operation 304, the layer 502 of bottom bit line of the memory device are formed on the interconnecting layer 404. A plurality of bottom bit line paths BBL_1-BBL_m are formed in the third metal layer M3. The plurality of bottom bit line paths BBL_1-BBL_m are arranged for outputting a plurality of bottom bit lines of the memory device respectively. A plurality of metal paths 504_1-504_m are formed in the fourth metal layer M4 for local inter-connection, in which the plurality of metal paths 504_1-504_m are electrically connected with the plurality of bottom bit line paths BBL_1-BBL_m by a plurality of vias 506_1-506_m respectively. In addition, a plurality of metal paths 508, 510, and a plurality of vias 512, 514 may be formed to electrically connect the metal path in the interconnecting layer 404.

Referring to FIG. 6, in operation 306, the plurality of conductive layers 602_1-602_a are formed on the layer 502 of the bottom bit line. The plurality of conductive layers 602_1-602_a are separated by a plurality of insulating layers 604_1-604_a. The plurality of insulating layers 604_1-604_a may be dielectric layers. It is noted that the plurality of bottom bit line paths BBL_1-BBL_m are not in contact with the conductive layer 602_1 in the operation 306.

Referring to FIG. 7, in operation 308, the plurality of bottom NAND strings 702_1-702_m are arranged to penetrate the plurality of conductive layers 602_1-602_a and the plurality of insulating layers 604_1-604_a (see FIG. 8) to reach the plurality of bottom bit line paths BBL_1-BBL_m respectively. Each of the plurality of bottom NAND strings 702_1-702_m comprises a channel layer (e.g. 704) and a dielectric layer (706), the channel layer is a pillar perpendicularly disposed on a corresponding metal path in the fourth metal layer M4, and the dielectric layer is surrounded the channel layer. The channel layer may be formed by polysilicon. The dielectric layer is arranged to be the gate stack of dielectric layer-charge storage layer dielectric layer of a field-effect transistor on the NAND string, and the channel layer is arranged to be a channel of the field-effect transistor. In other words, the dielectric layer comprises three stacked layers, i.e. two dielectric layers and a charge storage layer, in which the charge storage layer is formed between the two dielectric layers. According to some embodiments, in operation 308, a plurality of holes corresponding to the plurality of bottom NAND strings 702_1-702_m are formed by etching the plurality of conductive layers 602_1-602_a and the plurality of insulating layers 604_1-604_a (see FIG. 8). Then, the plurality of dielectric-charge storage-dielectric layers are formed on the inner surfaces of the holes respectively. Then, the plurality of channel layers are filled into the holes surrounded by the plurality of dielectric-charge storage-dielectric layers respectively.

Referring to FIG. 8, in operation 310, the plurality of conductive layers 602_1-602_a are patterned to formed the plurality of patterned conductive layers 802_1-802_a respectively. The lengths of the patterned conductive layers 802_1-802_a are gradually reduced to the patterned conductive layer 802_a from the patterned conductive layer 802_1 such that the plurality of patterned conductive layers 802_1-802_a form a staircase pattern. The plurality of patterned conductive layers 802_1-802_a may be a plurality of patterned polysilicon layers. According to some embodiments, in the operation 310, the plurality of insulating layers 604_1-604_a may be etched, re-filled, and planarized to rebuild the insulating layer as shown in FIG. 8.

Referring to FIG. 9, in operation 312, the conductive layer 902 (see also FIG. 10) is formed on the plurality of bottom NAND strings 702_1-702_m, wherein the plurality of channel layers 904_1-904_m are in contact with the bottom surface 906 of the conductive layer 902. According to some embodiments, the conductive layer 902 is formed in the fifth metal layer M5. In addition, in the operation 312, a plurality of vias 908_1-908_a and a plurality of metal paths 910_1-910_a are also formed, in which the plurality of vias 908_1-908_a are in contact with the plurality of patterned conductive layers 802_1-802_a respectively, and the plurality of metal paths 910_1-910_a are in contact with the plurality of vias 908_1-908_a respectively. The plurality of metal paths 910_1-910_a are formed in the fifth metal layer M5. Moreover, a via 912 and a metal path 914 may be formed to electrically connect the metal path 510 in the layer 502. The conductive layer 902 is electrically connected to a reference voltage level Vref, such as the ground voltage. The plurality of metal paths 910_1-910_a are electrically connected to a plurality word line control signals respectively.

Referring to FIG. 10, in operation 314, the plurality of top NAND strings 1002_1-1002_m are formed on the conductive layer 902. Each of the plurality of top NAND strings 1002_1-1002_m comprises a channel layer (e.g. 1004) and a dielectric layer (1006), the channel layer is a pillar perpendicularly disposed on the top surface 1008 of the conductive layer 902, and the dielectric layer is surrounded the channel layer. The channel layer may be formed by polysilicon. The dielectric layer is arranged to be the gate stack of dielectric layer-charge storage layer dielectric layer of a field-effect transistor on the NAND string, and the channel layer is arranged to be a channel of the field-effect transistor. According to some embodiments, in operation 314, a plurality of patterned conductive layers 1010_1-1010_a are also formed on the conductive layer 902. It is noted that the operation 314 is the repeat of the operations 306-310, and the detailed description is omitted here for brevity.

Referring to FIG. 11, in operation 316, the layer 1102 of top bit line of the memory device are formed. A plurality of top bit line paths TBL_1-TBL_m are formed on the plurality of top NAND strings 1002_1-1002_m respectively. The plurality of top bit line paths TBL_1-TBL_m are arranged for outputting a plurality of top bit lines of the memory device respectively. The plurality of top bit line paths TBL_1-TBL_m are formed in the seventh metal layer M7. In addition, a plurality of metal paths 1104_1-1104_m, a plurality of metal vias 1106_1-1106_m, and a plurality of metal vias 1108_1-1108_m are arranged to connect the plurality of top NAND strings 1002_1-1002_m and the plurality of top bit line paths TBL_1-TBL_m respectively. Moreover, in the operation 316, a plurality of vias 1110_1-1110_a and a plurality of metal paths 1112_1-1112_a are also formed, in which the plurality of vias 1110_1-1112_a are in contact with the plurality of patterned conductive layers 1010_1-1010_a respectively, and the plurality of metal paths 1112_1-1112_a are in contact with the plurality of vias 1110_1-1112_a respectively. The plurality of metal paths 1104_1-1104_m and 1112_1-1112_a are formed in the sixth metal layer M6. Moreover, a plurality of vias 1114, 1116, and a plurality of metal paths 1118, 1120 may be formed to electrically connect the metal path 914. The plurality of metal paths 1112_1-1112_a are electrically connected to a plurality word line control signals respectively.

Referring to FIG. 12, in operation 318, the top metal layer 1202 is formed on the layer 1102. The top metal layer 1202 is the eighth metal layer M8. A plurality of metal paths 1204, 1206, 1208, and a via 1210 may be formed in the top metal layer 1202 for connecting the metal path 1120.

According to the operations 302-318 of the method 300, a 3D NAND memory device is formed, in which each memory cell in the 3D NAND memory device is separated into two memory strings, and the two memory strings are connected by a common conductive layer. By doing this, the channel resistance of the memory cell is reduced. When the channel resistance of the memory cell is reduced, the current flowed to the common conductive layer from the top bit line, and/or the current flowed to the common conductive layer from the bottom bit line is increased. Accordingly, the ON state current of the memory cell is not degraded. By applying the present configuration, when more transistors are connected in series in a 3D NAND memory cell, the ON state current and the ON-OFF window of the 3D NAND memory cell may not degrade.

According to some embodiments, a memory device is provided. The memory device comprises a conductive layer, a first storage portion, and a second storage portion. The conductive layer is coupled to a reference voltage level. The first storage portion is vertically coupled to a first surface of the conductive layer. The second storage portion is vertically coupled to a second surface of the conductive layer; wherein the second surface is opposite to the first surface.

According to some embodiments, a memory device is provided. The memory device comprises a conductive layer, a first string of transistors, and a second string of transistors. The conductive layer is coupled to a reference voltage level. The first string of transistors has a first terminal coupled to a first surface of the conductive layer and a second terminal coupled to a first bit line, and the first transistor string is controlled by a plurality of first word line signals. The second string of transistors has a first terminal coupled to a second surface of the conductive layer, a second terminal coupled to a second bit line, and the second storage portion is controlled by a plurality of second word line signals;

According to some embodiments, a method of forming a memory device is provided. The method comprises: forming a first storage portion on a substrate; forming a conductive layer on the first storage portion, wherein the conductive layer has a first surface coupled to the first storage portion; and forming a second storage portion on a second surface of the conductive layer; wherein the second surface is opposite to the first surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
    a conductive reference layer, coupled to a reference voltage level, the conductive reference layer having an upper surface and a lower surface facing opposite to the upper surface;
    a first storage portion, vertically coupled to the upper surface of the conductive reference layer relative to a horizontal plane of the conductive reference layer, the first storage portion including a plurality of first channel layers disposed on and extending perpendicular to the upper surface of the conductive reference layer; a first dielectric layer, formed to surround substantially an entire length of the first channel layer; a plurality of first conductive layers; and a plurality of first insulating layers, interlaced with the plurality of first conductive layers, wherein the first channel layer is formed from a continuous solid conductive material in cross section;
    a second storage portion, vertically coupled to the lower surface of the conductive reference layer relative to the horizontal plane of the conductive reference layer and opposite to the first storage portion, the second storage portion including a plurality of second channel layers disposed on and extending perpendicular to the lower surface of the conductive reference layer, each of the plurality of second channel layers being aligned with a corresponding one of the plurality of first channel layers; a second dielectric layer, formed to surround substantially an entire length of the second channel layer, wherein the second channel layer and the second dielectric layer are formed under the first channel layer and the first dielectric layer respectively; a plurality of second conductive layers; and a plurality of second insulating layers, interlaced with the plurality of second conductive layers, wherein the second channel layer is formed from a continuous solid conductive material in cross section;
    at least a first conductive via disposed on a second end of the first channel layer and operatively connected to at least a first bit line;
    at least a second conductive via disposed on a second end of the second channel layer and operatively connected to at least a second bit line;
    an interconnection layer, the second storage portion being coupled to an upper surface of the interconnection layer; and
    a substrate layer, a lower surface of the interconnection layer being coupled an upper surface of the substrate layer, wherein the first storage portion and the second storage portion are operatively connected to the conductive reference layer such that a first current flowing through the first storage portion and a second current flowing through the second storage portion during operation flow into the conductive reference layer at the reference voltage level.

2. The memory device of claim 1, wherein the first storage portion comprises a plurality of first storage units, the plurality of first storage units are serially stacked on the upper surface, and the plurality of first storage units are operatively connected to receive a plurality of first word line signals respectively so as to be controlled by the plurality of first word line signals.

3. The memory device of claim 2, wherein the second storage portion comprises a plurality of second storage units, the plurality of second storage units are serially stacked on the lower surface, and the plurality of second storage units are operatively connected to receive a plurality of second word line signals respectively so as to be controlled by the plurality of second word line signals.

4. The memory device of claim 3, wherein each storage unit of the plurality of first storage units and the plurality of second storage units is formed by an n channel field-effect transistor, or each storage unit of the plurality of first storage units and the plurality of second storage units is formed by a p-channel field-effect transistor.

5. The memory device of claim 1,
wherein the plurality of first conductive layers and plurality of first insulating layers are vertically stacked on the upper surface of the conductive reference layer.

6. The memory device of claim 5,
wherein the plurality of second conductive layers and plurality of second insulating layers are vertically stacked on the lower surface of the conductive reference layer.

7. The memory device of claim 6, wherein
a plurality of third and fourth conductive vias are disposed on the plurality of first conductive layers and on the plurality of second conductive layers, respectively, and operatively connected to a plurality of word line signals.

8. A memory device, comprising:
a conductive reference layer, coupled to a reference voltage level, the conductive reference layer having an upper surface and a lower surface facing opposite to the upper surface;
a first plurality of strings of transistors, each of the first plurality of strings having a first terminal coupled to the upper surface of the conductive reference layer, a second terminal coupled to a first bit line, and each of the first plurality of transistor strings controlled by a plurality of first word line signals, wherein each of the first plurality of strings of transistors includes a first channel layer disposed on the upper surface of the conductive layer and extending perpendicular to the conductive layer; a first dielectric layer, arranged to surround substantially an entire length of the first channel layer; a plurality of first conductive layers, disposed on and in parallel with the conductive reference layer; and a plurality of first insulating layers, alternately disposed on the plurality of first conductive layers, wherein the first channel layer is formed from a continuous solid conductive material in cross section;
a second plurality of strings of transistors, each of the first plurality of strings having a first terminal coupled to the lower surface of the conductive reference layer, a second terminal coupled to a second bit line, and each of the second plurality of strings of transistors controlled by a plurality of second word line signals, wherein each of the second plurality of strings of transistors includes a second channel layer disposed on the lower surface of the conductive reference layer and extending perpendicular to the conductive reference layer, each of the second plurality of strings of transistors being aligned with a corresponding one of the first plurality of strings of transistors; a second dielectric layer, arranged to surround substantially an entire length of the second channel layer, wherein the second channel layer and the second dielectric layer are aligned to the first channel layer and the first dielectric layer respectively; a plurality of second conductive layers, disposed on and in parallel with the conductive reference layer; and a plurality of second insulating layers, alternately disposed on the plurality of second conductive layers, wherein the second channel layer is formed from a continuous solid conductive material in cross section;
at least a first conductive via disposed on a second end of the first channel layer and operatively connected to at least a first bit line;
at least a second conductive via disposed on a second end of the second channel layer and operatively connected to at least a second bit line;
an interconnection layer, the second string of transistors being disposed on an upper surface of the interconnection layer; and
a substrate layer, a lower surface of the interconnection layer being coupled an upper surface of the substrate layer, wherein the first string of transistors and the second string of transistors are operatively connected to the conductive reference layer such that a first current flowing through the first storage portion and a second current flowing through the second storage portion during operation flow into the conductive reference layer at the reference voltage level.

9. The memory device of claim 8, which is a NAND memory device controlled by a predetermined number of input signals, and the predetermined number is a total number of a plurality of first word line signals and a plurality of second word line signals.

10. The memory device of claim 8,
wherein the plurality of first conductive layers and plurality of first insulating layers are vertically stacked on the upper surface of the conductive reference layer.

11. The memory device of claim 10,
wherein the plurality of second conductive layers and plurality of second insulating layers are vertically stacked on the lower surface of the conductive reference layer relative to a horizontal plane of the conductive reference layer.

12. The memory device of claim 11, wherein
a plurality of third and fourth conductive vias are disposed on the plurality of first conductive layers and on the plurality of second conductive layers, respectively, and operatively connected to a plurality of word line signals.

13. A memory device, comprising:
a substrate;
an interconnecting layer, disposed on the substrate;
a conductive reference layer, coupled to a reference voltage level, and connected to the interconnecting layer; and
a storage portion, disposed on the interconnecting layer, wherein the storage portion comprises:
a plurality of first storage strings, vertically coupled to an upper surface of the conductive reference layer relative to a horizontal plane of the conductive reference layer, and
a plurality of second storage strings, vertically coupled to a lower surface of the conductive reference layer relative to the horizontal plane of the conductive reference layer, wherein the lower surface is facing opposite to the upper surface, wherein the plurality of first storage strings and the plurality of second storage strings are operatively connected to the conductive reference layer such that a first current flowing through the plurality of first storage strings and a second current flowing through the plurality of second storage strings during operation flow into the conductive reference layer at the reference voltage level,
wherein each of the plurality of second storage strings being aligned with a corresponding one of the plurality of first storage strings,
wherein each of the plurality of first storage strings includes a first channel layer disposed on the upper surface of the conductive reference layer and extending perpendicular to the conductive reference layer; a first dielectric layer, arranged to surround substantially an entire length of the first channel layer; a plurality of first conductive layers; and a plurality of first insulating layers, interlaced with the plurality of first conductive layers, the first channel layer being formed from a continuous solid conductive material in cross section, and wherein each of the plurality of second storage strings includes a second channel layer disposed on the lower surface of the conductive reference layer and extending perpendicular to the conductive reference layer; a second dielectric layer, arranged to surround substantially an entire length of the second channel layer; a plurality of second conductive layers; and a plurality of second insulating layers, interlaced with the plurality of second conductive layers, the second channel layer being formed from a continuous solid conductive material in cross section.

14. The memory device of claim 13, wherein each of the plurality of first storage strings comprises a plurality of first storage units, each of the plurality of second storage strings comprises a plurality of second storage units, the plurality of first storage units are controlled by a plurality of first word line signals respectively, and the plurality of second storage units are controlled by a plurality of second word line signals respectively.

15. The memory device of claim 14, wherein each of the plurality of first storage units and each of the plurality of second storage units are formed by n-channel field-effect transistors.

16. The memory device of claim 14, wherein each of the plurality of first storage units and each of the plurality of second storage units are formed by p-channel field-effect transistors.

17. The memory device of claim 14, wherein the plurality of first conductive layers and plurality of first insulating layers are vertically stacked on the upper surface of the conductive reference layer, and the plurality of first conductive layers are electrically connected to the plurality of first word line signals, respectively.

18. The memory device of claim 17, wherein the plurality of first channel layers are electrically connected to a plurality of first bit lines respectively.

19. The memory device of claim 17, wherein the plurality of second conductive layers and plurality of second insulating layers are vertically stacked on the lower surface of the conductive reference layer, and the plurality of second conductive layers are electrically connected to the plurality of second word line signals, respectively.

20. The memory device of claim 19, wherein the plurality of second channel layers are electrically connected to a plurality of second bit lines respectively.

* * * * *